(12) United States Patent
Guan et al.

(10) Patent No.: US 8,853,080 B2
(45) Date of Patent: Oct. 7, 2014

(54) METHOD FOR DEPOSITING TUNGSTEN FILM WITH LOW ROUGHNESS AND LOW RESISTIVITY

(71) Applicants: Yan Guan, Cupertino, CA (US); Abhishek Manohar, San Jose, CA (US); Deqi Wang, San Jose, CA (US); Feng Chen, Milpitas, CA (US); Raashina Humayun, Los Altos, CA (US)

(72) Inventors: Yan Guan, Cupertino, CA (US); Abhishek Manohar, San Jose, CA (US); Deqi Wang, San Jose, CA (US); Feng Chen, Milpitas, CA (US); Raashina Humayun, Los Altos, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/633,798

(22) Filed: Oct. 2, 2012

(65) Prior Publication Data

US 2014/0073135 A1 Mar. 13, 2014

Related U.S. Application Data

(60) Provisional application No. 61/698,700, filed on Sep. 9, 2012.

(51) Int. Cl.
*H01L 21/44* (2006.01)
(52) U.S. Cl.
USPC .............. 438/685; 438/680; 257/E21.168
(58) Field of Classification Search
USPC ................................................ 257/E21.16
See application file for complete search history.

(56) References Cited

U.S. PATENT DOCUMENTS

| | | | |
|---|---|---|---|
| 4,746,375 A | 5/1988 | Iacovangelo |
| 4,804,560 A | 2/1989 | Shioya et al. |
| 4,874,719 A | 10/1989 | Kurosawa |
| 5,028,565 A | 7/1991 | Chang et al. |
| 5,227,329 A | 7/1993 | Kobayashi et al. |
| 5,250,329 A | 10/1993 | Miracky et al. |
| 5,250,467 A | 10/1993 | Somekh et al. |
| 5,308,655 A | 5/1994 | Eichman et al. |
| 5,326,723 A | 7/1994 | Petro et al. |
| 5,370,739 A | 12/1994 | Foster et al. |
| 5,391,394 A | 2/1995 | Hansen |
| 5,567,583 A | 10/1996 | Wang et al. |
| 5,661,080 A | 8/1997 | Hwang et al. |
| 5,726,096 A | 3/1998 | Jung |

(Continued)

FOREIGN PATENT DOCUMENTS

| | | |
|---|---|---|
| EP | 0 437 110 | 7/1991 |
| EP | 1 156 132 | 11/2001 |

(Continued)

OTHER PUBLICATIONS

PCT Search Report, Completed Oct. 15, 2004, PCT/US2004/006940, Int'l filed May 3, 2004.

(Continued)

*Primary Examiner* — Cheung Lee
(74) *Attorney, Agent, or Firm* — Weaver Austin Villeneuve & Sampson LLP

(57) ABSTRACT

Methods of producing low resistivity tungsten bulk layers having low roughness and associated apparatus are provided. According to various embodiments, the methods involve CVD deposition of tungsten at high pressures and/or high temperatures. In some embodiments, the CVD deposition occurs in the presence of alternating nitrogen gas pulses, such that alternating portions of the film are deposited by CVD in the absence of nitrogen and in the presence of nitrogen.

19 Claims, 9 Drawing Sheets

(56) References Cited

U.S. PATENT DOCUMENTS

| | | |
|---|---|---|
| 5,795,824 A | 8/1998 | Hancock |
| 5,804,249 A | 9/1998 | Sukharev et al. |
| 5,817,576 A | 10/1998 | Tseng et al. |
| 5,833,817 A | 11/1998 | Tsai et al. |
| 5,913,145 A | 6/1999 | Lu et al. |
| 5,926,720 A | 7/1999 | Zhao et al. |
| 5,956,609 A | 9/1999 | Lee et al. |
| 6,001,729 A | 12/1999 | Shinriki et al. |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,265,312 B1 | 7/2001 | Sidhwa et al. |
| 6,277,744 B1 | 8/2001 | Yuan et al. |
| 6,294,468 B1 | 9/2001 | Gould-Choquette et al. |
| 6,297,152 B1 | 10/2001 | Itoh et al. |
| 6,309,966 B1 | 10/2001 | Govindarajan et al. |
| 6,310,300 B1 | 10/2001 | Cooney et al. |
| 6,355,558 B1 | 3/2002 | Dixit et al. |
| 6,404,054 B1 | 6/2002 | Oh et al. |
| 6,429,126 B1 | 8/2002 | Herner et al. |
| 6,465,347 B2 | 10/2002 | Ishizuka et al. |
| 6,551,929 B1 | 4/2003 | Kori et al. |
| 6,566,250 B1 | 5/2003 | Tu et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,627,066 B1 | 9/2003 | Isayama et al. |
| 6,635,965 B1 | 10/2003 | Lee et al. |
| 6,706,625 B1 | 3/2004 | Sudijono et al. |
| 6,720,261 B1 | 4/2004 | Anderson et al. |
| 6,740,221 B2 | 5/2004 | Cheung et al. |
| 6,740,585 B2 | 5/2004 | Yoon et al. |
| 6,777,331 B2 | 8/2004 | Nguyen |
| 6,797,340 B2 | 9/2004 | Fang et al. |
| 6,827,839 B2 | 12/2004 | Sonnenberg et al. |
| 6,844,258 B1 | 1/2005 | Fair et al. |
| 6,861,356 B2 | 3/2005 | Matsuse et al. |
| 6,902,763 B1 | 6/2005 | Elers et al. |
| 6,903,016 B2 | 6/2005 | Cohen |
| 6,905,543 B1 | 6/2005 | Fair et al. |
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,005,372 B2 | 2/2006 | Levy et al. |
| 7,141,494 B2 | 11/2006 | Lee et al. |
| 7,144,488 B2 | 12/2006 | Binstead et al. |
| 7,157,798 B1 | 1/2007 | Fair et al. |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,416,979 B2 | 8/2008 | Yoon et al. |
| 7,419,904 B2 | 9/2008 | Kato |
| 7,429,402 B2 | 9/2008 | Gandikota et al. |
| 7,465,665 B2 | 12/2008 | Xi et al. |
| 7,465,666 B2 | 12/2008 | Kori et al. |
| 7,501,343 B2 | 3/2009 | Byun et al. |
| 7,501,344 B2 | 3/2009 | Byun et al. |
| 7,563,718 B2 | 7/2009 | Kim |
| 7,589,017 B2 | 9/2009 | Chan et al. |
| 7,605,083 B2 | 10/2009 | Lai et al. |
| 7,611,990 B2 | 11/2009 | Yoon et al. |
| 7,655,567 B1 * | 2/2010 | Gao et al. ............... 438/685 |
| 7,674,715 B2 | 3/2010 | Kori et al. |
| 7,675,119 B2 | 3/2010 | Taguwa |
| 7,691,749 B2 | 4/2010 | Levy et al. |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,955,972 B2 | 6/2011 | Chan et al. |
| 7,977,243 B2 | 7/2011 | Sakamoto et al. |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwak et al. |
| 2002/0090796 A1 | 7/2002 | Desai et al. |
| 2002/0117399 A1 | 8/2002 | Chen et al. |
| 2002/0132472 A1 | 9/2002 | Park |
| 2002/0155722 A1 | 10/2002 | Satta et al. |
| 2002/0168840 A1 | 11/2002 | Hong et al. |
| 2002/0177316 A1 | 11/2002 | Miller et al. |
| 2003/0059980 A1 | 3/2003 | Chen et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen et al. |
| 2003/0190802 A1 | 10/2003 | Wang |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0202786 A1 | 10/2004 | Wongsenakhum et al. |
| 2004/0206267 A1 | 10/2004 | Sambasivan et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 * | 9/2005 | Matsuse et al. ............... 438/202 |
| 2006/0003581 A1 | 1/2006 | Johnston et al. |
| 2006/0075966 A1 | 4/2006 | Chen et al. |
| 2006/0094238 A1 | 5/2006 | Levy et al. |
| 2006/0284317 A1 | 12/2006 | Ito et al. |
| 2007/0099420 A1 | 5/2007 | Dominquez et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2009/0045517 A1 | 2/2009 | Sugiura et al. |
| 2009/0053893 A1 | 2/2009 | Khandelwal et al. |
| 2009/0057151 A1 | 3/2009 | Shalyt et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0035427 A1 | 2/2010 | Chan et al. |
| 2010/0055904 A1 | 3/2010 | Chen et al. |
| 2010/0130003 A1 | 5/2010 | Lin et al. |
| 2010/0159694 A1 | 6/2010 | Chandrashekar et al. |
| 2010/0199887 A1 | 8/2010 | Chan et al. |
| 2010/0267230 A1 | 10/2010 | Chandrashekar et al. |

(56) References Cited

U.S. PATENT DOCUMENTS

| | | |
|---|---|---|
| 2010/0267235 A1 | 10/2010 | Chen et al. |
| 2010/0273327 A1 | 10/2010 | Chan et al. |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0231626 A1 | 9/2012 | Lee et al. |
| 2012/0244699 A1 | 9/2012 | Khandelwal et al. |
| 2013/0109172 A1 | 5/2013 | Collins et al. |
| 2013/0168864 A1 | 7/2013 | Lee et al. |
| 2013/0171822 A1 | 7/2013 | Chandrashekar et al. |
| 2013/0302980 A1 | 11/2013 | Chandrashekar et al. |
| 2014/0011358 A1 | 1/2014 | Chen et al. |
| 2014/0027664 A1 | 1/2014 | Wei et al. |
| 2014/0030889 A1 | 1/2014 | Chen et al. |

FOREIGN PATENT DOCUMENTS

| | | |
|---|---|---|
| EP | 1 179 838 | 2/2002 |
| JP | 08-115984 | 5/1996 |
| JP | 09-027596 | 1/1997 |
| JP | H10-144688 | 5/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2004-235456 | 8/2004 |
| JP | 2005-518088 | 6/2005 |
| JP | 2007-009298 | 1/2007 |
| JP | 2007-027680 | 2/2007 |
| JP | 2007-507892 | 3/2007 |
| JP | 2007-250907 | 9/2007 |
| JP | 2007-251164 | 9/2007 |
| JP | 2008-283220 | 11/2008 |
| JP | 2009-024252 | 2/2009 |
| JP | 2009-144242 | 7/2009 |
| KR | 20050022261 | 3/2005 |
| KR | 20050087428 | 8/2005 |
| KR | 10-2006-0074593 | 7/2006 |
| KR | 20060087844 | 8/2006 |
| KR | 705936 | 4/2007 |
| KR | 20080110897 | 12/2008 |
| KR | 10-2009-0103815 | 10/2009 |
| WO | WO 98/51838 | 11/1998 |
| WO | 01/29893 | 4/2001 |
| WO | WO01/27347 | 4/2001 |
| WO | WO 02/41379 | 5/2002 |
| WO | 03/029515 | 4/2003 |
| WO | 2005/027211 | 3/2005 |
| WO | 10-2007-0012525 | 1/2007 |
| WO | 2007/121249 | 10/2007 |
| WO | WO2010/025357 | 3/2010 |
| WO | 2013/090295 | 6/2013 |
| WO | 2013/148444 | 10/2013 |
| WO | 2013/148880 | 10/2013 |

OTHER PUBLICATIONS

Written Opinion, Completed Oct. 15, 2004, PCT/US2004/006940, Int'l filed May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten Lpcvd from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

Wongsenakhum et al., "Method of Forming Low-Resistivity Tungsten Interconnects," Novellus Systems, Inc., U.S. Appl. No. 10/815,560, filed Mar. 31, 2004.

U.S. Office Action mailed Jul. 12, 2005, from U.S. Appl. No. 10/815,560.

Lee et al., "Method for Producing Ultra Thin Tungsten Layer With Improved Step Coverage," Novellus Systems, Inc., U.S. Appl. No. 09/975,074, filed Oct. 9, 2001.

U.S. Office Action mailed Jul. 17, 2002, from U.S. Appl. No. 09/975,074.

Lee et al., "Method for Producing Ultra Thin Tungsten Layer With Improved Step Coverage," Novellus Systems, Inc., U.S. Appl. No. 10/649,351, filed Aug. 26, 2003.

U.S. Office Action mailed Feb. 8, 2005, from U.S. Appl. No. 10/649,351.

U.S. Final Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

Fair et al., "Selective Refractory Metal and Nitride Capping," Novellus Systems, Inc., U.S. Appl. No. 10/435,010, filed May 9, 2003.

U.S. Office Action mailed Jun. 22, 2004, from U.S. Appl. No. 10/435,010.

Levy et al., "Deposition of Tungsten Nitride," Novellus Systems, Inc., U.S. Appl. No. 10/690,492, filed Oct. 20, 2003.

U.S. Office Action mailed Mar. 23, 2005, from U.S. Appl. No. 10/690,492.

Fair et al., "Selective Refractory Metal and Nitride Capping," Novellus Systems, Inc., U.S. Appl. No. 10/984,126, filed Nov. 8, 2004.

U.S. Office Action mailed Nov. 23, 2005, from U.S. Appl. No. 10/984,126.

Levy et al., "Deposition of Tungsten Nitride", Novellus Systems, Inc., filed Dec. 16, 2005, U.S. Appl. No. 11/305,368, pp. 1-39.

U.S. Final Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Final Office Action mailed May 17, 2006, from U.S. Appl. No. 10/984,126.

U.S. Office Action mailed Sep. 28, 2006, from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

Chan et al., "Methods for Growing Low-Resistivity Tungsten for High Aspect Ratio and Small Features," Novellus Systems, Inc., U.S. Appl. No. 12/030,645, filed Feb. 13, 2008.

(56) References Cited

OTHER PUBLICATIONS

Humayun et al., "Methods for Forming All Tungsten Contacts and Lines," Novellus Systems, Inc., U.S. Appl. No. 11/963,698, filed Dec. 21, 2007.
Chan et al., "Method for Improving Uniformity and Adhesion of Low Resistivity Tungsten Film," Novellus Systems, Inc., U.S. Appl. No. 11/951,236, filed Dec. 5, 2007.
Notice of Allowance and Fee Due mailed Mar. 12, 2003, from U.S. Appl. No. 09/975,074.
Notice of Allowance and Fee Due mailed Jul. 21, 2006, from U.S. Appl. No. 10/649,351.
Notice of Allowance and Fee Due mailed Oct. 7, 2004, from U.S. Appl. No. 10/435,010.
Notice of Allowance and Fee Due mailed Aug. 25, 2006, from U.S. Appl. No. 10/984,126.
Notice of Allowance and Fee Due mailed Sep. 14, 2005, from U.S. Appl. No. 10/690,492.
Notice of Allowance and Fee Due mailed Apr. 24, 2007, from U.S. Appl. No. 10/815,560.
U.S. Office Action mailed Jun. 27, 2008, from U.S. Appl. No. 11/305,368.
Chan et al., "Methods for Growing Low-Resistivity Tungsten Film," Novellus Systems, Inc., U.S. Appl. No. 11/265,531, filed Nov. 1, 2005.
U.S. Office Action mailed Aug. 21, 2008, from U.S. Appl. No. 11/265,531.
Ashtiani et al., "Ternary Tungsten-Containing Thin Film Heater Elements," Novellus Systems, Inc., U.S. Appl. No. 61/025,237, filed Jan. 31, 2008.
Chen et al., "Method for Reducing Tungsten Roughness and Improving Reflectivity," Novellus Systems, Inc., U.S. Appl. No. 12/202,126, filed Aug. 29, 2008.
U.S. Office Action mailed Oct. 16, 2008, from U.S. Appl. No. 11/349,035.
U.S. Office Action mailed Sep. 29, 2008, from U.S. Appl. No. 11/782,570.
Ashtiani et al., "Ternary Tungsten-Containing Thin Films," Novellus Systems, Inc., U.S. Appl. No. 12/363,330, filed Jan. 30, 2009.
Chandrashekar et al., "Method for depositing thin tungsten film with low resistivity and robust micro-adhesion characteristics," Novellus Systems, Inc., U.S. Appl. No. 61/061,078, filed Jun. 12, 2008.
U.S. Final Office Action mailed Apr. 28, 2009, from U.S. Appl. No. 11/782,570.
U.S. Office Action mailed Apr. 3, 2009, from U.S. Appl. No. 11/305,368.
U.S. Final Office Action mailed Feb. 26, 2009, from U.S. Appl. No. 11/265,531.
U.S. Notice of Allowance mailed May 4, 2009 from U.S. Appl. No. 11/265,531.
U.S. Final Office Action mail Feb. 25, 2009, from U.S. Appl. No. 11/349,035.
U.S. Office Action mailed Jun. 11, 2009, from U.S. Appl. No. 11/963,698.
U.S. Office Action mailed Jun. 4, 2009, from U.S. Appl. No. 11/349,035.
Ken K. Lai and H. Henry Lamb, Precursors for Organometallic Chemical Vapor Deposition of Tungsten Carbide Films, 1995, Chemistry Material, pp. 2284-2292.
U.S. Office Action mailed Jun. 24, 2009 from U.S. Appl. No. 12/030,645.
U.S. Office Action mailed Aug. 5, 2009, from U.S. Appl. No. 11/951,236.
Ashtiani et al., "Ternary Tungsten-Containing Resistive Thin Films," Novellus Systems, Inc., U.S. Appl. No. 12/363,330, filed Jan. 30, 2009.
Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.
U.S. Office Action mailed Oct. 21, 2009 from U.S. Appl. No. 12/202,126.
U.S. Notice of Allowance mailed Nov. 17, 2009 from U.S. Appl. No. 11/305,368.
U.S. Final Office Action mailed Nov. 20, 2009 from U.S. Appl. No. 11/349,035.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Chan et al., "Methods for Growing Low-Resistivity Tungsten Filml", Novellus Systems Inc., U.S. Appl. No. 12/538,770, filed Aug. 10, 2009.
U.S. Final Office Action mailed Jan. 13, 2010 from U.S. Appl. No. 12/030,645.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Dec. 11, 2009, U.S. Appl. No. 12/636,616.
U.S. Office Action mailed Jan. 26, 2010 from U.S. Appl. No. 11/951,236.
U.S. Notice of Allowance mailed Mar. 2, 2010 from U.S. Appl. No. 11/349,035.
Danek, et al, "Tungsten Barrier and Seed for Copper Filled TSV," Novellus Systems, Inc., filed Mar. 12, 2010, U.S. Appl. No. 12/723,532.
Chandrashekar, et al., "Method for Forming Tungsten Contacts and Interconnects with Small Critical Dimensions," Novellus Systems, Inc, filed Apr. 6, 2010, U.S. Appl. No. 12/755,248.
Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.
U.S. Notice of Allowance mailed Apr. 6, 2010 from U.S. Appl. No. 11/951,236.
U.S. Office Action mailed May 3, 2010 from U.S. Appl. No. 12/407,541.
U.S. Final Office Action mailed May 7, 2010 from U.S. Appl. No. 12/202,126.
Chan et al., "Method for Improving Uniformity and Adhesion of Low Resistivity Tungsten Film," Novellus Systems, Inc., U.S. Appl. No. 12/829,119, filed Jul. 1, 2010.
U.S. Office Action mailed Jun. 11, 2010 from U.S. Appl. No. 11/963,698.
U.S. Final Office Action mailed Jul. 23, 2010 from U.S. Appl. No. 12/030,645.
U.S. Office Action mailed Jul. 26, 2010 from U.S. Appl. No. 12/202,126.
International Search Report and Written Opinion mailed Apr. 12, 2010 from Application No. PCT/US2009/055349.
Hoover, Cynthia, "Enabling Materials for Contact Metallization," Praxair Electronic Materials R&D, Jul. 2007, pp. 1-16.
Purchase of ethylcyclopentadienyl)dicarbonylnitrosyltungsten from Praxair in Oct. 2006.
U.S. Final Office Action mailed Oct. 19, 2010 from U.S. Appl. No. 12/407,541.
U.S. Office Action for U.S. Appl. No. 12/538,770 mailed Nov. 23, 2010.
U.S. Final Office Action for U.S. Appl. No. 11/963,698 mailed Dec. 30, 2010.
U.S. Office Action for U.S. Appl. No. 12/636,616 mailed Jan. 25, 2011.
U.S. Final Office Action mailed Feb. 7, 2011 from U.S. Appl. No. 12/202,126.
Notice of Allowance and Fee Due mailed Jan. 24, 2011, from U.S. Appl. No. 12/030,645.
Chan et al., "Methods for Growing Low-Resistivity Tungsten for High Aspect Ratio and Small Features," Novellus Systems, Inc., U.S. Appl. No. 13/095,734, filed Apr. 27, 2011.
U.S. Office Action for U.S. Appl. No. 12/407,541 mailed May 2, 2011.

(56) References Cited

OTHER PUBLICATIONS

U.S. Office Action for U.S. Appl. No. 12/755,248 mailed May 13, 2011.
U.S. Office Action for U.S. Appl. No. 12/556,490 mailed Jun. 14, 2011.
U.S. Final Office Action for U.S. Appl. No. 12/636,616 mailed Jun. 15, 2011.
Notice of Allowance for U.S. Appl. No. 12/538,770 mailed Jun. 30, 2011.
U.S. Office Action for U.S. Appl. No. 12/829,119, mailed Jun. 30, 2011.
Notice of Allowance mailed Jul. 25, 2011, for U.S. Appl. No. 12/363,330.
Korean First Notification of Provisional Rejection mailed Dec. 8, 2010, dated Application No. 2004-0036346.
Notice of Allowance mailed Sep. 2, 2011, for U.S. Appl. No. 11/963,698.
Notice of Allowance mailed Sep. 19, 2011, for U.S. Appl. No. 12/407,541.
Chan et al., "Methods of Controlling Tungsten Film Properties," Novellus Systems, Inc., U.S. Appl. No. 13/020,748, filed Feb. 3, 2011.
Chandrashekar et al., "Method for Depositing Thin Tungsten Film With Low Resistivity and Robust Micro-Adhesion Characteristics," Novellus Systems, Inc., U.S. Appl. No. 13/244,016, filed Sep. 23, 2011.
U.S. Office Action for U.S. Appl. No. 12/755,248 mailed Oct. 28, 2011.
Notice of Allowance for U.S. Appl. No. 12/636,616 mailed Sep. 30, 2011.
Humayun et al., "Methods for Forming All Tungsten Contacts and Lines," Novellus Systems, Inc., U.S. Appl. No. 13/276,170, filed Oct. 18, 2011.
U.S. Final Office Action for U.S. Appl. No. 12/829,119, mailed Nov. 17, 2011.
U.S. Appl. No. 12/755,259, Office Action mailed Feb. 16, 2012.
Notice of Allowance for U.S. Appl. No. 12/556,490 mailed Mar. 2, 2012.
U.S. Office Action, dated May 10, 2012, issued in U.S. Appl. No. 13/020,748.
U.S. Office Action for U.S. Appl. No. 13/244,016, mailed Mar. 6, 2012.
U.S. Office Action for U.S. Appl. No. 12/829,119, mailed Apr. 19, 2012.
U.S. Office Action for U.S. Appl. No. 13/276,170, mailed Apr. 16, 2012.
U.S. Final Office Action for U.S. Appl. No. 12/755,248 mailed Apr. 30, 2012.
Notification of Provisional Rejection mailed Jul. 17, 2012, for Application No. 2010-0087997.
Office Action for U.S. Appl. No. 13/095,734, mailed Aug. 6, 2012.
Notice of Allowance for U.S. Appl. No. 12/829,119, mailed Aug. 7, 2012.
Notification of Provisional Rejection mailed Sep. 6, 2012, for Application No. 2011-7004322.
U.S. Final Office Action dated Sep. 12, 2012 issued in U.S. Appl. No. 12/755,259.
U.S. Appl. No. 13/560,688, filed Jul. 27, 2012, entitled "Methods of improving Tungsten Contact Resistance in Small Critical Dimension Features,".
U.S. Appl. No. 13/633,502, filed Oct. 2, 2012, entitled "Method for Producing Ultra-Thin Tungsten Layers With Improved Step Coverage,".
Notice of Allowance dated Dec. 3, 2012, issued in U.S. Appl. No. 13/095,734.
US Notice of Allowance, dated Oct. 4, 2012, issued in U.S. Appl. No. 13/276,170.
US Office Action, dated Jan. 7, 2013, issued in U.S. Appl. No. 12/202,126.
Notice of Allowance dated Nov. 29, 2012, issued in U.S. Appl. No. 13/244,016.
US Office Action, dated Feb. 15, 2013, issued in U.S. Appl. No. 12/755,248.
US Office Action dated Dec. 18, 2012, issued in U.S. Appl. No. 12/723,532.
US Final Office Action, dated Nov. 16, 2012, issued in U.S. Appl. No. 13/020,748.
Korean Second Notification of Provisional Rejection, dated Aug. 25, 2011, issued in Application No. 2004-0036346.
Korean Office Action, dated Jun. 13, 2011, issued in Application No. 2011-0032098.
Korean Office Action dated Mar. 21, 2013 issued in KR Application No. 2010-0024905.
Korean Office Action dated Mar. 4, 2013 in KR Application No. 2010-0035449.
Korean Office Action dated Mar. 4, 2013 in KR Application No. 2010-0035453.
U.S. Appl. No. 13/862,048, filed Apr. 12, 2013, entitled "CVD Based Metal/Semiconductor Ohmic Contact for High Volume Manufacturing Applications."
U.S. Appl. No. 13/758,928, filed Feb. 4, 2013, entitled "Methods for Forming All Tungsten Contacts and Lines."
U.S. Appl. No. 13/851,885, filed Mar. 27, 2013, entitled "Tungsten Feature Fill."
US Notice of Allowance, dated Jan. 19, 2005, issued in U.S. Appl. No. 10/435,010.
US Notice of Allowance, dated Jun. 7, 2013, issued in U.S. Appl. No. 12/202,126.
US Office Action dated Jul. 18, 2012, issued in U.S. Appl. No. 12/723,532.
US Notice of Allowance, dated Jul. 10, 2013, issued in U.S. Appl. No. 12/755,259.
US Office Action, dated May 10, 2012, issued in U.S. Appl. No. 13/020,748.
US Office Action, dated Jun. 20, 2013, issued in U.S. Appl. No. 13/650,688.
PCT Search Report and Written Opinion, dated Jan. 19, 2005, issued in PCT/US2004/006940.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008310322.
Chinese Office Action dated Sep. 18, 2012 issued in application No. 200980133560.1.
Chinese Office Action dated Aug. 7, 2013 issued in application No. 200980133560.1.
PCT International Search Report and Written Opinion, dated Mar. 28, 2013, issued in PCT/US2012/069016.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
U.S. Appl. No. 14/135,375, filed Dec. 19, 2013, entitled "Method for Depositing Extremely Low Resistivity Tungsten,".
U.S. Appl. No. 14/173,733, filed Feb. 5, 2014, entitled "Tungsten Nucleation Process to Enable Low Resistivity Tungsten Feature Fill."
U.S. Appl. No. 14/097,160, filed Dec. 4, 2013, entitled "Methods for Depositing Ultra Thin Low Resistivity Tungsten Film for Small Critical Dimension Contacts and Interconnects."
U.S. Appl. No. 13/928,216, filed Jun. 26, 2013, entitled "Methods of Forming Tensile Tungsten Films and Compressive Tungsten Films,".
US Office Action, dated Apr. 7, 2014, issued in U.S. Appl. No. 13/633,502.
US Notice of Allowance dated Dec. 24, 2013, issued in U.S. Appl. No. 12/723,532.
US Notice of Allowance dated Sep. 4, 2013 issued in U.S. Appl. No. 12/755,259.
US Office Action, dated Feb. 24, 2014, issued in U.S. Appl. No. 13/020,748.

(56) References Cited

OTHER PUBLICATIONS

US Final Office Action, dated Feb. 14, 2014, issued in U.S. Appl. No. 13/560,688.
Japanese Office Action dated Sep. 3, 2013, issued in Application No. JP 2008325333.
PCT International Preliminary Report on Patentability and Written Opinion, dated Mar. 10, 2011, issued in PCT/US2009/055349.
Japanese Office Action dated Dec. 3, 2013 issued in Application No. 2011525228.
Korean Office Action dated Jul. 19, 2013 issued in Application No. 2011-7004322.
Korean Office Action dated Nov. 4, 2013 issued in Application No. 10-2013-7027117.
Japanese Office Action dated Mar. 4, 2014 issued in JP 2010-093522.
Korean Second Office Action dated Jan. 25, 2014 in KR Application No. 10-2010-0035453.
Becker, Jill (Apr. 7, 2003) "Diffusion barrier properties of tungsten nitride films grown by atomic layer deposition from bis(tert-butylimido)bis(dimethylamido) tungsten and ammonia," Applied Physics Letters, 82(14):2239-2241, [Retrieved online Dec. 13, 2013 at http://dx.doi.org/10.1063/1.1565699].
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf], Materials Transactions, 43(7):1585-1592.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.

\* cited by examiner

METHOD FOR DEPOSITING TUNGSTEN FILM WITH LOW ROUGHNESS AND LOW RESISTIVITY

CROSS-REFERENCE TO RELATED APPLICATION

This application claims benefit under 35 USC. §119(e) of U.S. Provisional Patent Application No. 61/698,700, filed Sep. 9, 2012, which is incorporated by reference herein in its entirety.

FIELD OF INVENTION

This invention relates to methods for preparing tungsten films. Embodiments of the invention are useful for integrated circuit applications that require thin tungsten films having low electrical resistivity and low roughness.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer.

SUMMARY OF INVENTION

Methods of producing low resistivity tungsten bulk layers having low roughness and associated apparatus are provided. According to various embodiments, the methods involve CVD deposition of tungsten at high pressures and/or high temperatures. In some embodiments, the CVD deposition occurs in the presence of alternating nitrogen gas pulses, such that alternating portions of the film are deposited by CVD in the absence of nitrogen and in the presence of nitrogen.

One aspect relates to a method of forming a tungsten film on a substrate including exposing the substrate to simultaneous flows of a tungsten-containing precursor and a reducing agent such that the reducing agent and the tungsten-containing precursor react to thereby form a tungsten film on the substrate in a first chemical vapor deposition (CVD) process, with the substrate exposed intermittently to nitrogen during the exposure to simultaneous flows of the tungsten-containing precursor and the reducing agent and with the chamber pressure maintained at greater than about 60 Torr during the first CVD process. In some embodiments, the chamber pressure can be between about 80 Torr and 100 Torr. Examples of reducing agents include hydrogen. The resistivity of the deposited tungsten film can be less than about 10 micro-ohm-cm at 500 Angstroms and roughness of 4 nm, 2 nm or less.

In some embodiments, the substrate temperature during the first CVD process is greater than about 420° C., for example about 440° C. or higher. A second CVD process may be performed prior to the first CVD process. The second CVD process can be performed with no nitrogen present and/or at a temperature of less than about 350° C.

The method can further include depositing a tungsten nucleation layer on the substrate prior to the first CVD process. In some embodiments, depositing the tungsten nucleation layer involves alternatingly pulsing a reducing agent and a tungsten containing precursor over the substrate to deposit the nucleation layer by a pulsed nucleation layer (PNL) process. The substrate temperature during the PNL process may be less than about 350° C. in certain embodiments. The method can include exposing the substrate to multiple pulses of a reducing agent prior to the first CVD process. In some embodiments, the multiple pulses of the reducing agent are without any intervening tungsten-containing precursor pulses.

Another aspect relates to a method of forming a tungsten film on a substrate including depositing a tungsten bulk layer by a chemical vapor deposition (CVD) process having two or more cycles, each of which includes at least one CVD operation in which a tungsten-containing precursor is reduced by a reducing agent in the absence of nitrogen to deposit tungsten and at least one CVD operation in which a tungsten-containing precursor is reduced by a reducing agent in the presence of nitrogen to deposit tungsten. The process pressure during the CVD process is maintained at least about 60 Torr. No intermediate deposition reactions typically take place between cycles. In some embodiments, the process pressure is maintained at least about 80 Torr throughout the CVD process. In some embodiments, the substrate temperature throughout the CVD process is at least about 420° C.

Another aspect relates to an apparatus for depositing tungsten film on a substrate including a) a first station in a processing chamber, the first station having a first substrate support; b) one or more gas inlets to the first station; and c) a controller for controlling the operations in the first station, the controller including instructions for flowing a tungsten-containing precursor and a reducing agent into the first station; and while flowing the tungsten-containing precursor and reducing agent, pulsing nitrogen in the station with delays between the pulses. The controller can further include instructions for maintaining a process chamber pressure of at least 60 Torr and/or a substrate support temperature of at least about 420° C. In some embodiments, the processing chamber includes one or more additional stations. In some embodiments, the processing chamber includes only one station having a substrate support.

These and other aspects of the invention are described further below.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the present invention, which pertains to forming thin tungsten films. Modifications, adaptations or variations of specific methods and structures shown and discussed herein will be apparent to those skilled in the art and are within the scope of this invention.

The methods described herein relate to forming tungsten films. Embodiments of the present invention involve depositing tungsten layers that have low resistivity and low roughness. In previous processes, low resistivity tungsten film has been achieved by growing large tungsten grains. This, however, increases the roughness of the film. As a result, percentage root mean square (RMS) roughness to film thickness may exceed 10% for a low resistivity tungsten film of 500 Å or greater film. Lowering the roughness of the film makes subsequent operations (patterning, etc.) easier.

The methods described herein involve chemical vapor deposition of tungsten by reduction of tungsten by a reducing agent in the presence of alternating nitrogen gas pulses at high temperature and/or pressure.

Figure 1:
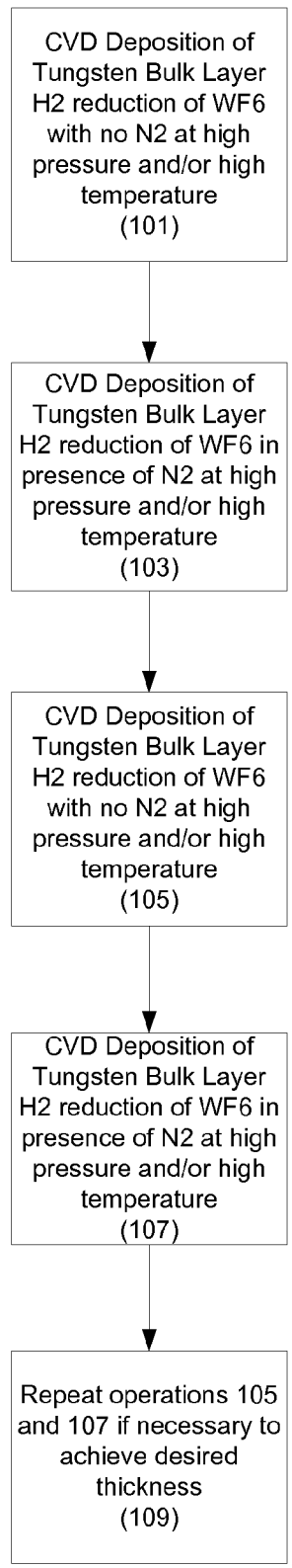
FIG. 1 is a process flow diagram showing relevant operations of methods according to various embodiments.

FIG. 1 shows a process according to certain embodiments of the invention. Deposition begins by a chemical vapor deposition (CVD) process in which a tungsten-containing precursor is reduced by hydrogen to deposit tungsten. While tungsten hexafluoride (WF6) is often used, the process may be performed with other tungsten precursors, including, but not limited to, WCl6. In addition, while hydrogen is generally used as the reducing agent in the CVD deposition of the bulk tungsten layer, other reducing agents including silane may be used in addition or instead of hydrogen without departing from the scope of the invention. In another embodiment, W(CO)6 may be used with or without a reducing agent. The benefits derived from nitrogen (N2) exposure may also be derived from exposure to other carrier gases that contain nitrogen, including NH3. By using NH3, or other types of nitrogen-containing precursors, the process described may be modified to deposit tungsten nitride with similar advantages.

Unlike atomic layer deposition (ALD) or pulsed nucleation layer (PNL) processes, in a CVD technique, the $WF_6$ and $H_2$ are simultaneously introduced into the reaction chamber. This produces a continuous chemical reaction of mix reactant gases that continuously forms tungsten film on the substrate surface.

The CVD deposition begins in an operation 101 in which the tungsten-containing precursor and hydrogen are introduced into the reaction chamber without any nitrogen being present. In certain embodiments, argon or another carrier gas is used as a carrier gas. The gases may be pre-mixed or not. The gases are allowed to react to deposit a portion of the desired total thickness of tungsten. As discussed below, the amount of tungsten deposited in this operation depends in part on the total desired thickness. For example, in certain embodiments, about 100 Å is deposited in this operation. The tungsten film deposited in operation 101 may be deposited over a tungsten nucleation layer deposited in a previous process. This is described further below. Typically, the subsequent CVD depositions in FIG. 1 do not include further nucleation layer depositions; rather tungsten formed by each CVD operation is formed directly on the tungsten formed by the previous operation in FIG. 1.

Next, in an operation 103, another portion of the tungsten layer is deposited by H2 reduction of WF6 or other tungsten-precursor, in the presence of nitrogen. Generally, transitioning from operation 101 (H2-WF6 reduction/no N2) to operation 103 (H2-WF6 reduction/N2) involves turning on a flow of N2 into the chamber, such that N2, H2 and WF6 are all flowing into the chamber. The argon or other gas flow may be reduced or stopped during this portion of the process to compensate for the additional N2 gas introduced, thereby balancing the flows. One or more of the WF6 and the H2 may be stopped after operation 101 and started again for operation 103. Another portion of the tungsten layer is deposited in this operation. During the entire process in FIG. 1, including operations 101 and 103, the pressure and/or temperature is high. High pressure is between 40 torr and 500 torr. In some embodiments, the pressure is between about 60 torr and 150 torr, or between about 80 torr and 100 torr. High temperature may be between about 350° C. and 500° C. In some embodiments, the temperature is at least about 420° C., or greater than 430°, e.g., between 440° C. and 460° C. In some embodiments, only one of high temperature and high pressure may be employed in certain embodiments. In certain embodiments, temperature and pressure generally remain constant throughout the process in FIG. 1. As discussed further below, in certain embodiments, the use of high pressure, high temperature and alternating nitrogen exposure together provides low resistivity and low roughness levels otherwise unattainable.

In certain embodiments, if the desired amount of tungsten has been deposited, the process ends here. For depositing thick films, e.g., 1000 Å, more cycles are performed. This is indicated at an operation 105, in which H2-WF6 reduction CVD without nitrogen present is again performed at high pressure and temperature. Transitioning from operation 103 to operation 105 typically involves turning off the flow of nitrogen, and if necessary, re-introducing any flow of argon or other gas that was reduced or stopped during or after operation 103. Another portion of the tungsten layer is deposited. This is followed by another portion of the tungsten layer being deposited by H2 reduction of WF6 or other tungsten-precursor, in the presence of nitrogen in an operation 107 at high pressure and/or temperature. One or more additional cycles of N2 and no-N2 H2 reductions of WF6 are then performed if necessary to reach the desired thickness in operation 109. In certain embodiments, the process may also end after repeating only operation 105 on the final cycle. Still further, the CVD deposition may begin with a N2 H2 reduction.

In another embodiment, pulses of N2 and tungsten containing precursor are simultaneously introduced into the chamber (e.g., with N2 as the carrier gas for the tungsten precursor) with delays such that pulsed N2-present reduction operations are performed without any intervening H2-only reduction operations. Such a sequence is described in US Patent Publication No. 2010-0055904-A1, incorporated by reference herein.

Figure 2:
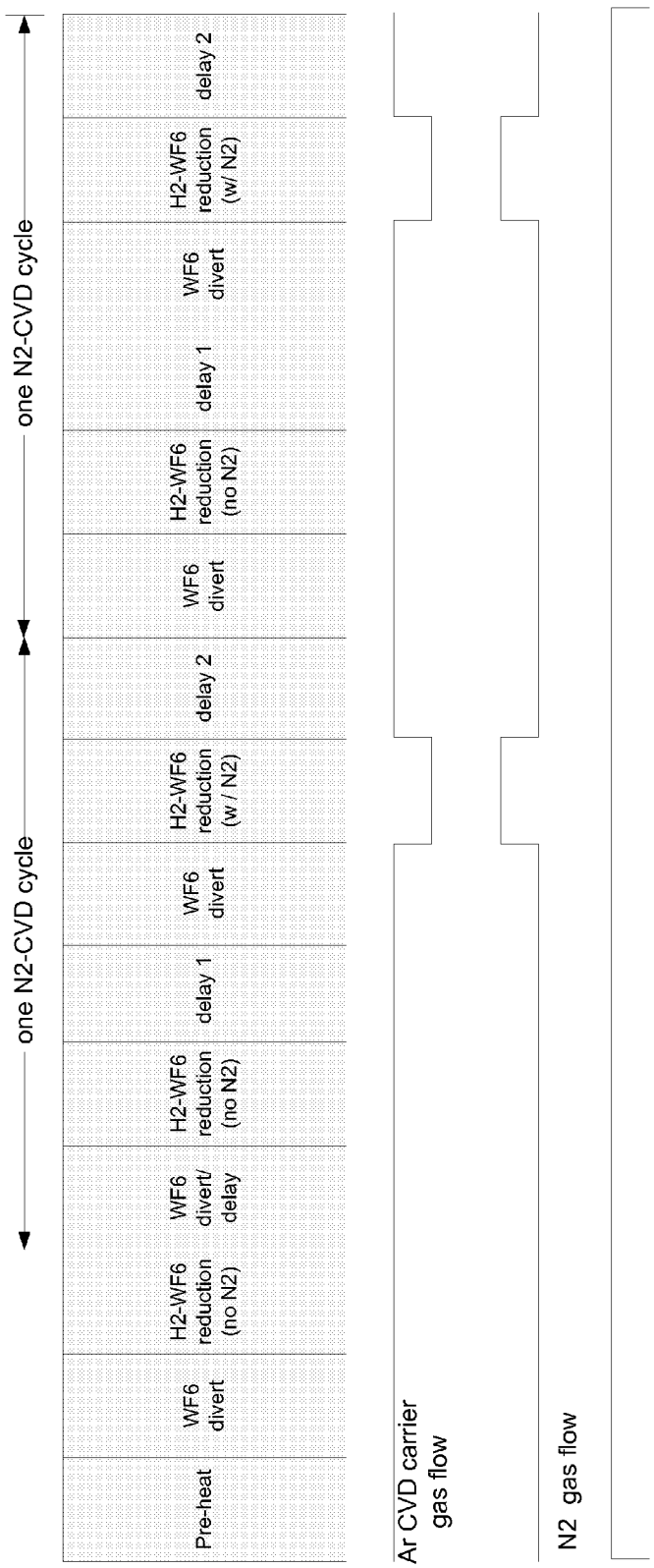
FIG. 2 is a timing sequence of tungsten precursor, reducing agent, and nitrogen flows according to various embodiments.

FIG. 2 shows an example of a timing sequence according to certain embodiments of the invention. Prior to beginning a N2 CVD cycle described in FIG. 1 above, a pre-heat and first H2 (no N2) reduction may occur as indicated. Both the pre-heat and the first deposition are optional. In certain embodiments, pre-heating the wafer to the process temperature assists in decreasing resistance non-uniformity. Also, in certain embodiments, to achieve good response and repeatability, the tungsten precursor agent may be diverted to a process vacuum pump. This allows the flow to stabilize before introducing the precursor into the deposition chamber. In the embodiment depicted in FIG. 2, the WF6 flow is diverted before and after each CVD deposition, with the WF6 flowed into the chamber during the deposition. Two cycles of the N2-CVD deposition are depicted in FIG. 2, though the number of N2-CVD cycles may range from 1 to any desired number. It has been found that multiple N2-CVD cycles, e.g., 2-5, improve the roughness over a single cycle. Each N2-CVD cycle has a H2-only reduction, followed by a delay (delay 1). This delay may range from 0-1 min, e.g., 2 or 3 seconds. Note that although depicted sequentially, the WF6 divert and the delays are typically concurrent, i.e., the WF6 is diverted during the delay between reductions. In certain embodiments, there is no divert and tungsten is flowed into the chamber throughout the process. Each N2-CVD cycle also has a H2 reduction with N2, also followed by a delay (delay 2). A delay of at least 1-3 seconds has been shown to improve the roughness over processes that do not have a delay after the N2-present H2 reduction. It is believed that this is due to the nitrogen remaining in the chamber passivating the surface of the deposited film, allowing the following H2-only film to deposit in a smoother fashion.

Tungsten precursor flow is indicated on the timing sequence. Argon or other carrier gas, hydrogen and nitrogen flow into the chamber is indicated below the sequence. As shown, argon flow remains constant, except for the H2 reduction in N2, in which it is reduced or stopped to account for the additional N2 gas. H2 remains constant throughout the process, while N2 is flowed only during the H2 reduction in the presence of N2. As indicated above, the tungsten hexafluoride may also be flowed throughout each cycle and/or the hydrogen reducing agent may be diverted during the delay between WF6 reductions.

Note that this process differs considerably from a process described in U.S. Pat. No. 7,141,494, which describes H2 reduction of WF6 in the presence of nitrogen to deposit a tungsten bulk layer. As described in that patent, a process gas including, e.g., WF6-H2, WF6-B2H6 or W(CO)6 is introduced into the deposition chamber. Nitrogen is also introduced into the deposition chamber, either before, during or after the process gas is introduced into the chamber. In certain situations, the nitrogen is introduced just after the deposition process begins in order to allow the tungsten to nucleate. Once the nitrogen is introduced, however, the deposition proceeds without additional pulsing of the nitrogen. While the process described in the '494 patent results in improved roughness over tungsten deposited in the absence of nitrogen, pulsing nitrogen throughout the process results in improving roughness and improving reflectivity. This is discussed in U.S. Patent Publication No. 2010-0055904-A1, incorporated by reference herein.

Figure 3:
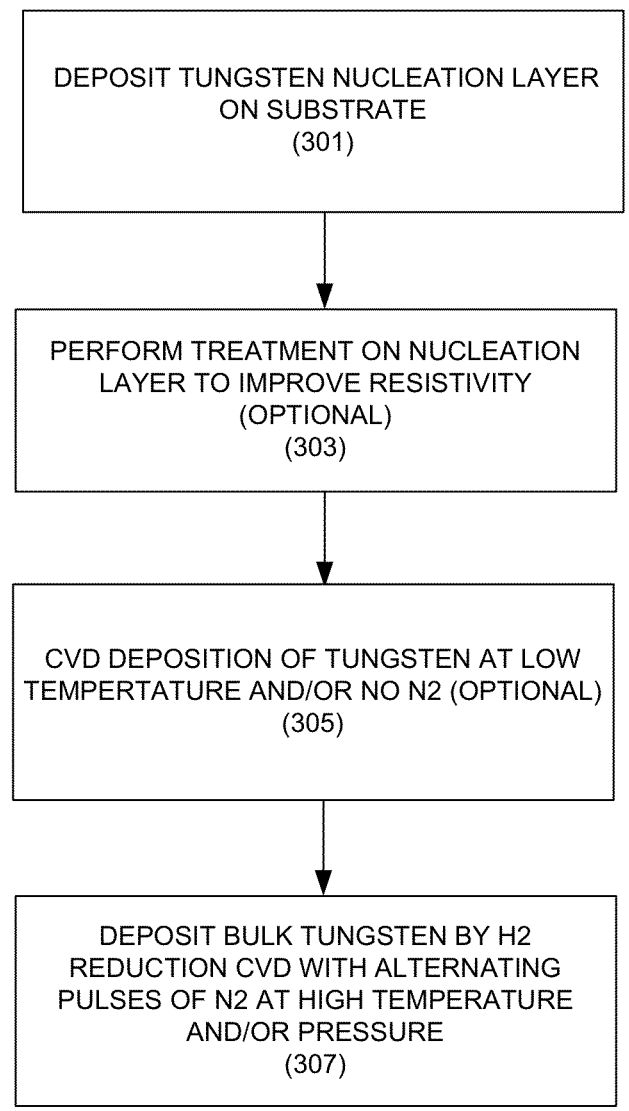
FIG. 3 is a process flow diagram showing relevant operations of methods according to various embodiments.

FIG. 3 provides a process flow diagram according to various embodiments. The process begins by depositing a tungsten nucleation layer on a substrate in an operation 301. In general, a nucleation layer is a thin conformal layer which serves to facilitate the subsequent formation of a bulk material thereon. In certain embodiments, the nucleation layer is deposited using a pulsed nucleation layer (PNL) technique. In a PNL technique, pulses of the reducing agent, purge gases, and tungsten-containing precursors are sequentially injected into and purged from the reaction chamber. The process is repeated in a cyclical fashion until the desired thickness is achieved. PNL broadly embodies any cyclical process of sequentially adding reactants for reaction on a semiconductor substrate.

As features become smaller, the tungsten (W) contact or line resistance increases due to scattering effects in the thinner W film. While efficient tungsten deposition processes require tungsten nucleation layers, these layers typically have higher electrical resistivities than the bulk tungsten layers. Low resistivity tungsten films minimize power losses and overheating in integrated circuit designs. Because the $\rho_{nucleation} > \rho_{bulk}$, the thickness of the nucleation layer should be minimized to keep the total resistance as low as possible. On the other hand, the tungsten nucleation should be sufficiently thick to fully cover the underlying substrate to support high quality bulk deposition.

PNL techniques for depositing tungsten nucleation layers that have low resistivity and that support deposition of low resistivity tungsten bulk layers are described in U.S. Pat. Nos. 7,589,017, 7,772,114, 7,955,972, and 8,058,170, incorporated by reference herein. Additional discussion regarding PNL type processes can be found in U.S. Pat. Nos. 6,635,965, 6,844,258, 7,005,372, and 7,141,494, incorporated by reference herein. In some embodiments, the substrate temperature is low—below about 350° C., for example between about 250° C. and 350° C. or 250° C. and 325° C. In certain embodiments, the temperature is around 300° C. According to various embodiments, boron-containing (e.g., diborane) reducing agents can be used to deposit the nucleation layers, with the substrate exposed to alternating boron-containing reducing agent and tungsten-containing precursor pulses. Other reducing agents may be used instead of or in addition to boron-containing reducing agents. For example, the substrate can be exposed to alternating silane and tungsten-containing precursor pulses in addition to or instead of alternating boron-containing reducing agent and tungsten-containing precursor pulses. According to various embodiments, the nucleation layer may be between about 3 Å and 50 Å, depending on the particular application and substrate. For example, for deposition of planar or blanket films, the nucleation layer may be as thin as 3 Å-5 Å, while a thicker nucleation layer, e.g., about 10 Å, may be used for feature fill applications. In certain embodiments, methods for depositing tungsten nucleation layers in very small/high aspect ratio features as described in U.S. Pat. No. 7,955,972, are used to deposit the nucleation layer. These methods involve using PNL cycles of a boron-containing reducing agent and a tungsten-containing precursor with no hydrogen in the background to deposit very thin tungsten nucleation layers in these features that have good step coverage. In certain embodiments, the pressure or temperature during the process in FIG. 3 is held constant. For example, high pressure as described above with respect to FIG. 1, is used for all operations in FIG. 3, including operation 301. For example, the pressure during operation 301 may be between about 60 torr and 150 torr.

In some embodiments, temperature is held constant throughout the process described in FIG. 3. Relatively low temperatures for operation 301 are described above. These may be used throughout the process in certain embodiments, including during operations 303-307. Relatively high temperatures are described with reference to FIG. 1. These may be used throughout the process in certain embodiments. In embodiments in which temperature is held constant, pressure may be varied.

While the above discussion provides methods of deposition of low resistivity tungsten nucleation layers according to certain embodiments, the methods described herein are not limited to a particular method of tungsten nucleation layer deposition, but include deposition of bulk tungsten film on tungsten nucleation layers formed by any method including PNL, atomic layer deposition (ALD), CVD, and any other method.

Referring back to FIG. 3, an optional operation 303 involves a treatment process to lower resistivity. Examples of treatment process such are described in such as that described in U.S. Pat. Nos. 7,772,114, and 8,058,170, incorporated by reference herein. The treatment process described therein involves exposing the deposited nucleation layer to multiple pulses of a reducing agent (with or without intervening pulses of another reactive compound). According to various embodiments, the substrate having the nucleation layer deposited thereon is exposed to multiple cycles of reducing agent pulses, or in some embodiments, alternating reducing agent and a tungsten-containing precursor pulses. In some embodiments, the pulse times are shorter than those employed in operation 301. For example, a 1 s pulse time may be employed in operation 303 and 2 s pulse in operation 301. In some embodiments, multiple pulses of diborane or other boron-containing reducing agents without intervening pulses of a tungsten-containing precursor are employed. According to various embodiments, the treatment process can be performed at a temperatures ranging from 375° C. to 415° C., e.g., about 395° C. If the nucleation layer is formed at a lower temperature, transitioning from nucleation layer deposition to this treatment operation may involve heating the substrate to between about 350° C. and 415° C., or in certain embodiments to about 375° C. to 415° C. and allowing it to stabilize before exposing the nucleation layer to a plurality of reducing agent or reducing agent/tungsten-containing precursor pulses. As indicated in certain embodiments the substrate temperature is about 395° C. Lower temperatures may be used with longer pulse times to achieve equivalent treatment effect. As discussed above with respect to operation 301, the pressure may be relatively high, e.g., above 40 torr, above about 60 torr, or above about 80 torr. In embodiments in which temperature is held constant throughout the process in FIG. 3, the temperature may range from about 250° C. to 500° C.

According to various embodiments, the operation 303 lowers resistivity of the tungsten film deposited in FIG. 3. Without being bound by a particular theory, it is believed that operation 303 may delay nucleation and/or allow nuclei to coalesce thereby contributing to the growth of large grains and lowering resistivity. Higher pressure as described above with respect to FIG. 1 is beneficial for this operation. While the treatment process described in operation 303 may be used to lower resistivity, in some embodiments the methods described herein can be implemented without it.

An optional CVD process may be performed in an operation 305. If performed, operation 305 is performed at low temperature and/or with no N2 present during the deposition. As with the CVD deposition described in FIG. 1, operation 305 can involve WF6 reduction by H2. This operation can bolster the nucleation layer, improve uniformity and/or lower resistivity. For deposition of planar or blanket films, operation 305 can be used to deposit a film of about 10 Å to 100 Å in some embodiments, for example, 20 Å. For feature fill, operation 305 can deposit a film thick enough to entirely or substantially fill the feature(s). Reduced temperature CVD operations for feature fill are described in U.S. patent application Ser. No. 12/755,248, incorporated by reference herein, and can include CVD depositions between 250° C. and 340° C., e.g., at 300° C. The pressure during operation 305, if performed, can be high as described above.

Next, a bulk tungsten layer can be deposited by H2 reduction with alternating pulses of N2 at high temperature and/or high pressure in an operation 307. This is described above with respect to FIG. 1. Thickness can be deposited as appropriate for the application.

As indicated above, the processes described in FIGS. 1-3 can be performed to deposit blanket films and for feature fill. In conventional processes, pressure and temperature lower than the high temperature and pressure regimes described above with respect to FIG. 1 are employed. It would be expected that the high pressures and temperatures would result in poor step coverage for feature fill, as the sticking coefficient increases at high pressure and reaction rate increases at high temperature, with high sticking coefficient and reaction rate resulting in more deposition at the top of a feature, reducing step coverage. However, as described below, high pressure and/or high temperature with the N2 pulsing has been found to result in low resistivity and/or low roughness films for blanket and feature fill applications, and to provide good step coverage.

EXPERIMENTAL

450 Å thick blanket films were deposited using N2 pulsing as described above with respect to FIG. 2 at 300° C., 395° C., 430° C. and 445° C. and RMS roughness was measured. Pressure was 90 torr for all depositions. Results are in Table 1.

TABLE 1

Temperature Effect on Roughness

| N2-pulse CVD Temperature (° C.) | Roughness at 450 Å (nm) |
|---|---|
| 300 | 6.6 |
| 395 | 4.3 |
| 430 | 3.1 |
| 445 | 1.9 |

The results indicate that high temperatures provide smoother films.

450 Å thick blanket films were deposited using N2 pulsing as described above with respect to FIG. 2 at 40 torr, 60 torr and 90 torr and RMS roughness was measured. Temperature was 445° C. for all depositions. Results are in Table 2.

TABLE 1

Pressure Effect on Roughness

| N2-pulse CVD Pressure (torr) | Roughness at 450 Å (nm) |
|---|---|
| 40 | 3.6 |
| 60 | 3.1 |
| 90 | 1.9 |

The results indicate that high pressures provide smoother films, with higher pressure and temperature providing the smoothest films.

Figure 4A:
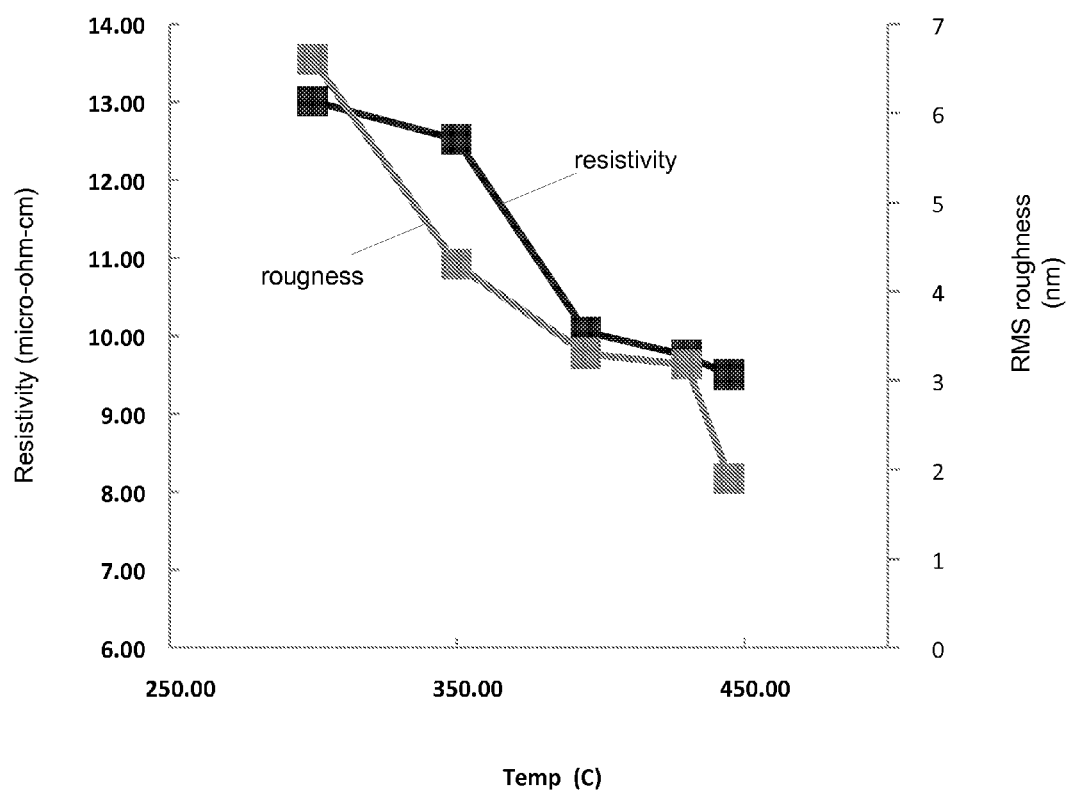
FIG. 4A is a graph illustrating the effect of temperature on resistivity and roughness on N2-pulsed CVD deposition of tungsten.
Figure 4B:
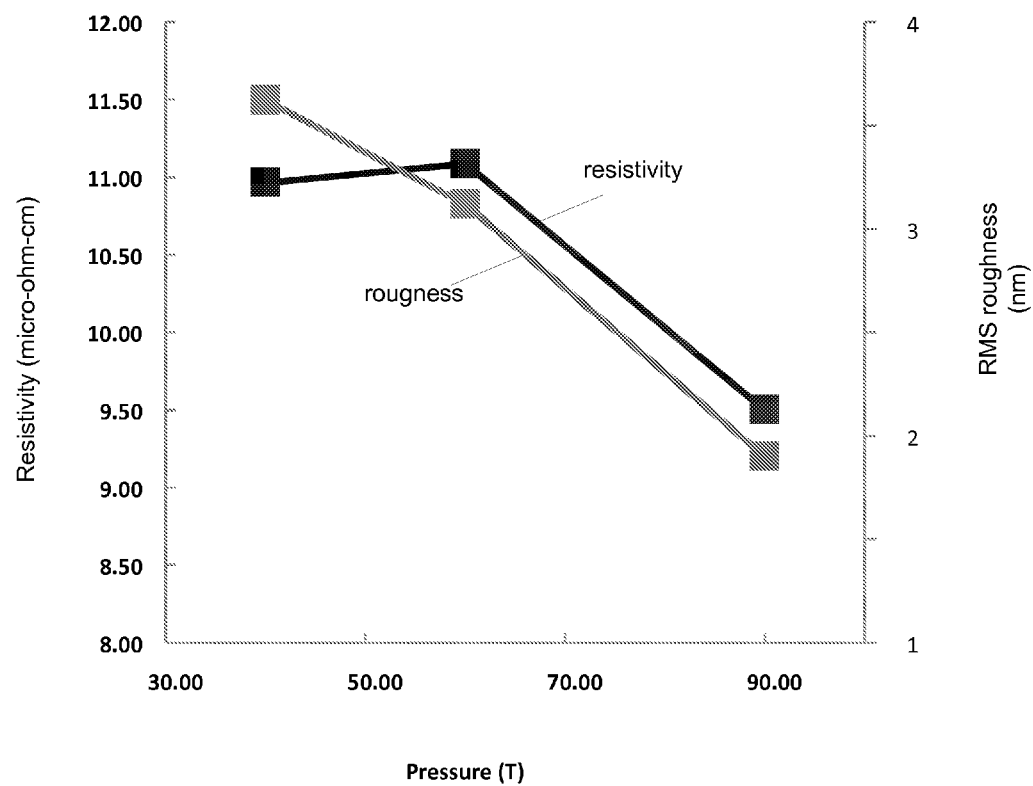
FIG. 4B is a graph illustrating the effect of pressure on resistivity and roughness on N2-pulsed CVD deposition of tungsten.

Resistivity was also measured for the deposited films with results shown in FIGS. 4A and 4B. The effect of temperature is shown in FIG. 4A, with the effect of pressure shown in FIG. 4B. FIG. 4A shows that increasing temperature lowers resistivity, with FIG. 4B showing that increasing pressure also lowers resistivity. The roughness results are also shown in FIGS. 4A and 4B to illustrate that resistivity and roughness both decrease. This is notable in that it would be expected that roughness and resistivity would be negatively correlated, with large grain size lowering resistivity and increasing roughness and small grain sizes increasing resistivity and lowering roughness.

Figure 5A:
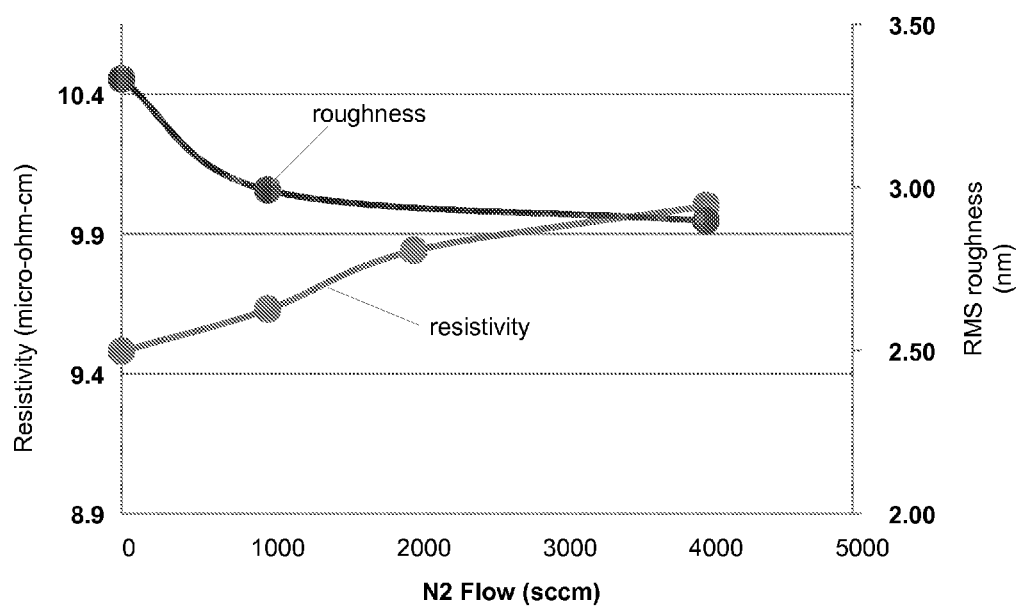
FIGS. 5A and 5B are graphs illustrating the effect of nitrogen flow rate on resistivity and roughness on N2-pulsed CVD deposition of tungsten.
Figure 5B:
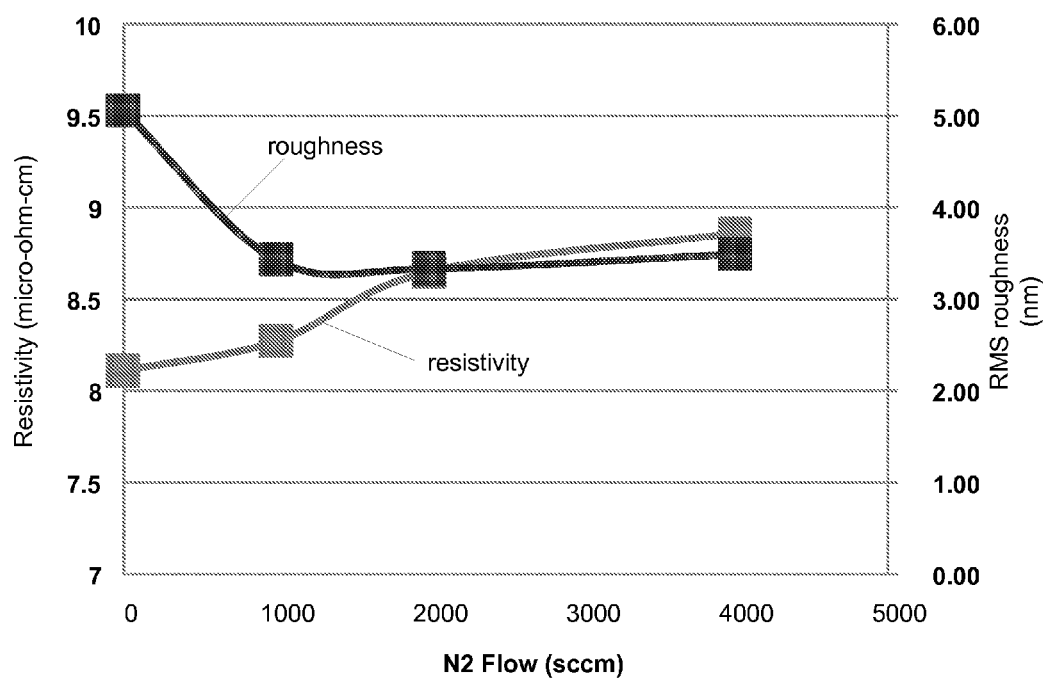

300 Å and 450 Å thick blanket films were deposited using N2 pulsing as described above with respect to FIG. 2 at different N2 flow rates with resistivity and RMS roughness measured. Temperature and pressure were 445° C. and 90 Torr, respectively. The results for the 300 Å are shown in FIG. 5A and for the 450 Å in FIG. 5B. The results show that the addition of N2 helps reduce the tungsten roughness.

Figure 6:
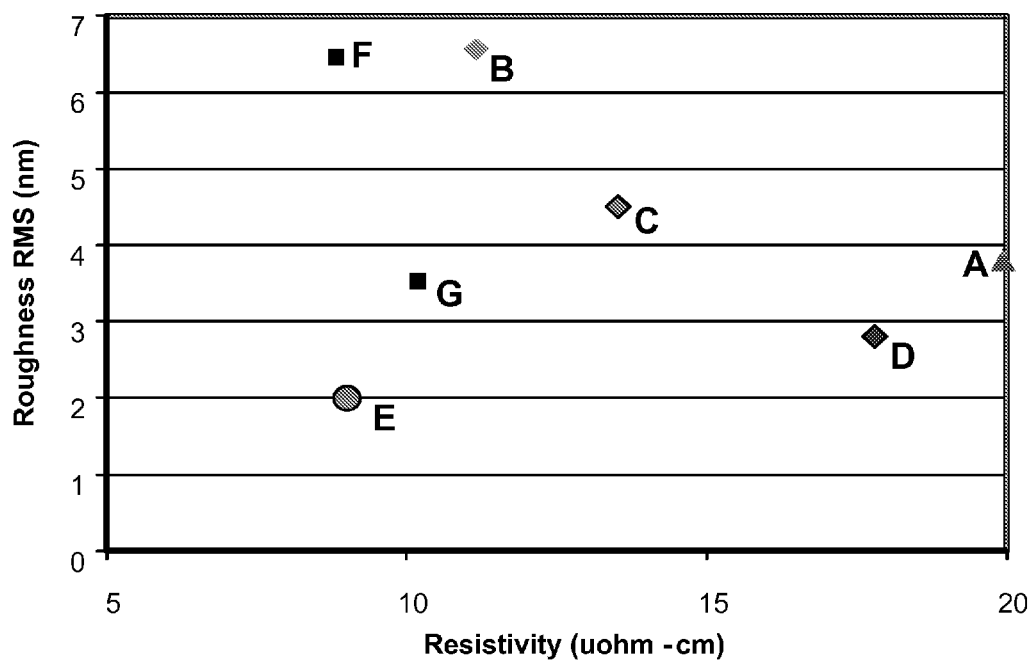
FIG. 6 is a graph showing resistivity and roughness of tungsten films deposited by various processes.

FIG. 6 shows roughness and resistivity results for the following processes:

TABLE 3

Process conditions

| | Nucleation | Treatment | Bulk CVD layer |
|---|---|---|---|
| A | B/W/S/W + x(S/W) in H2 ambient; 300° C.; 40 Torr | none | H2 reduction of WF6; no N2; ~400° C. and 40 torr |
| B | x(B/W) in H2-free ambient; 300° C.; 40 Torr | x(B/W) at 395° C. | H2 reduction of WF6; no N2; ~400° C. and 40 torr |
| C | x(B/W) in H2-free ambient; 300° C.; 40 Torr | x(B/W) at 395° C. | H2 reduction of WF6; pulsed N2; ~400° C. and 40 torr |
| D | B/W + x(S/W) in H2 ambient; 300° C.; 40 Torr | x(B/W) at 395° C. | H2 reduction of WF6; pulsed N2; ~400° C. and 40 torr |
| E | x(B/W) in H2 ambient; 300° C.; 90 Torr | x(B/W) at 395° C. | H2 reduction of WF6; pulsed N2; 445° C. and 90 torr |
| F | x(B/W) in H2 ambient; 300° C.; 80 Torr | x(B/W) at 395° C. | H2 reduction of WF6; no N2; 445° C. and 95 torr |
| G | x(B/W) in H2 ambient; 300° C.; 80 Torr | x(B/W) at 395° C. | H2 reduction of WF6; N2 during second half of deposition; 445° C. and 95 torr |

In Table 3, B indicates a diborane pulse, W indicates a tungsten hexafluoride pulse, and S indicates a silane pulse. "x" indicates multiple cycles. While resistivity can be improved at the expense of roughness, or vice versa, using the processes A-D, process E, in which the bulk CVD layer is deposited by H2 reduction of WF6 with and without N2 at high pressure and temperature results in both the lowest resistivity and roughness of all processes.

As indicated above, the processes described herein may be used for feature fill as well as for blanket film deposition. Table 4, below, shows comparable resistivity and roughness results for blanket and plugfill films.

| | Thickness (Å) | Rt (micro-ohm-cm) | RMS (nm) |
|---|---|---|---|
| Blanket | 450 | 8.60 | 1.97 |
| Plugfill | 478 | 9.54 | 1.80 |

The opening of the plugfill feature was 80 nm with a depth of 430 nm. Tungsten film step coverage was 100%.

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface. Another station may be used to for a treatment operation as described above. One or more stations can then be used to perform CVD as described above. Two or more stations may be used to perform CVD in a parallel processing. Alternatively a wafer may be indexed to have the CVD operations performed over two or more stations sequentially.

Figure 7:
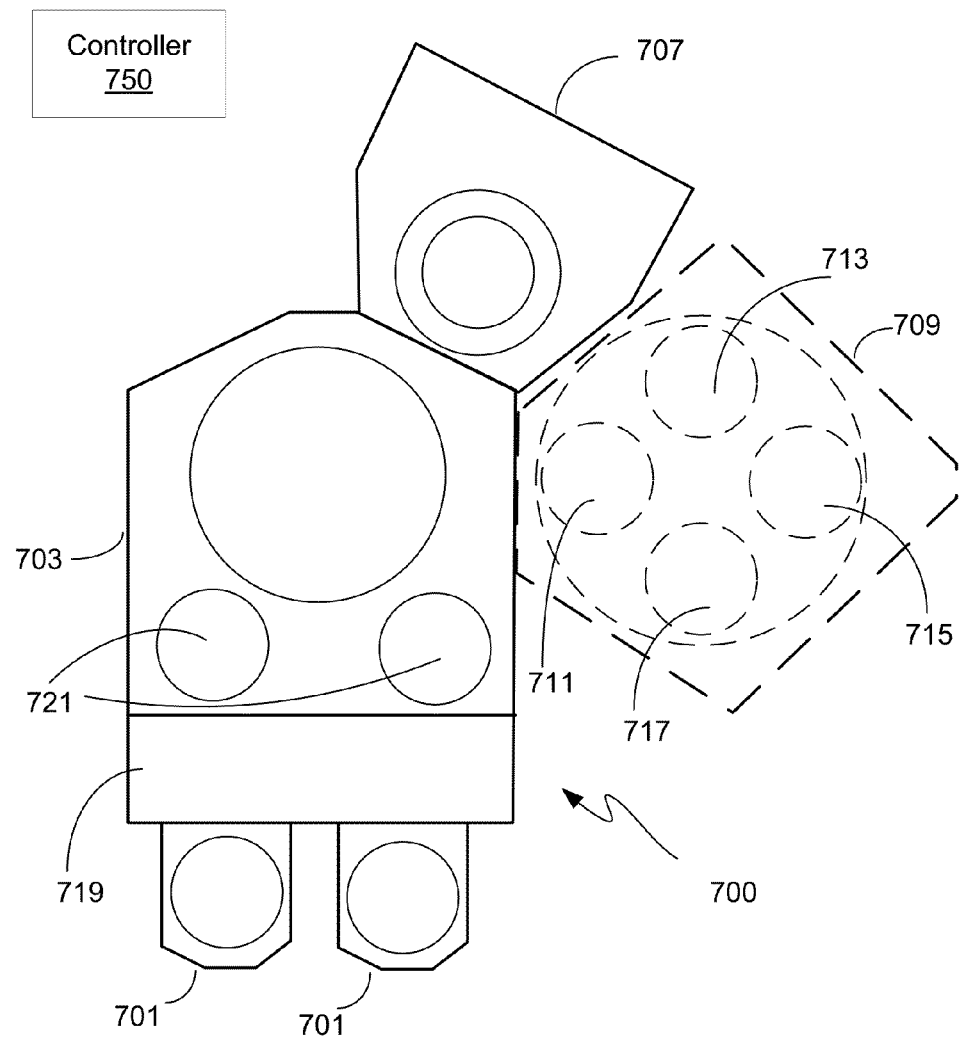
FIG. 7 is a block diagram of a processing system suitable for conducting tungsten deposition process in accordance with embodiments of the invention.

FIG. 7 is a block diagram of a processing system suitable for conducting tungsten thin film deposition processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing PNL deposition, multi-pulse treatment if desired, and CVD according to embodiments of the invention. Chamber 709 may include multiple stations 711, 713, 715, and 717 that may sequentially perform these operations. For example, chamber 709 could be configured such that station 711 performs PNL deposition, station 713 performs multi-pulse treatment, and stations 715 and 717 can perform N2-pulsed CVD. In some embodiments, station 715 can perform N2-free CVD, and 717 can perform N2-pulsed CVD.

Also mounted on the transfer module 703 may be one or more single or multi-station modules 707 capable of performing plasma or chemical (non-plasma) pre-cleans. The module may also be used for various other treatments, e.g., post liner tungsten nitride treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller 750 is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language:

for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

APPLICATIONS

The present invention may be used to deposit thin, low resistivity tungsten layers for many different applications. One application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required. Another example is for plugfill or other feature fill applications.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of forming a tungsten film on a semiconductor substrate in a chamber, the method comprising:
    exposing the substrate to simultaneous flows of a tungsten-containing precursor and a reducing agent such that the reducing agent and the tungsten-containing precursor react to thereby form a tungsten film on the substrate in a first chemical vapor deposition (CVD) process,
    wherein the substrate is exposed intermittently to nitrogen during the exposure to simultaneous flows of the tungsten-containing precursor and the reducing agent and wherein the chamber pressure is greater than about 60 Torr during the first CVD process.

2. The method of claim 1, wherein the substrate temperature during the first CVD process is greater than about 420° C.

3. The method of claim 2, further comprising a second CVD process performed prior to the first CVD process, wherein the substrate temperature during the second CVD process is less than about 350° C.

4. The method of claim 1, wherein the chamber pressure is between about 80 Torr and 100 Torr.

5. The method of claim 1, wherein the resistivity of the deposited tungsten film is less than about 10 micro-ohm-cm at 500 Angstroms.

6. The method of claim 1, further comprising depositing a tungsten nucleation layer on the substrate prior to the first CVD process.

7. The method of claim 6, wherein depositing the tungsten nucleation layer comprises alternating pulses of a reducing agent and a tungsten containing precursor over the substrate to deposit the nucleation layer by a pulsed nucleation layer (PNL) process.

8. The method of claim 7, wherein the substrate temperature during the PNL process is less than about 350° C.

9. The method of claim 1, further comprising exposing the substrate to multiple pulses of a reducing agent prior to the first CVD process.

10. The method of claim 1, wherein the deposited film has a roughness of 2 nm or less.

11. The method of claim 1, wherein the reducing agent is hydrogen.

12. The method of claim 1, wherein exposing intermittently to nitrogen during the exposure to simultaneous flows of the tungsten-containing precursor and the reducing agent comprises flowing the reducing agent and the tungsten-containing precursor to deposit a first sub-layer of the tungsten film not in the presence of nitrogen and flowing the reducing agent, tungsten-containing precursor, and nitrogen to deposit a second sub-layer of the tungsten film in the presence of nitrogen.

13. The method of claim 12, wherein the flow of the tungsten-containing precursor is diverted or stopped between deposition of the first and second sub-layers.

14. The method of claim 1, wherein the chamber pressure is greater than 80 Torr.

15. The method of claim 1, wherein the chamber pressure is between about 60 Torr and 90 Torr.

16. A method forming a tungsten film on a semiconductor substrate in a chamber, the method comprising:

exposing the substrate to multiple pulses of a reducing agent prior to a first chemical vapor deposition (CVD) process, and exposing the substrate to simultaneous flows of a tungsten-containing precursor and a reducing agent such that the reducing agent and the tungsten-containing precursor react to thereby form a tungsten film on the substrate in the first CVD process, wherein the substrate is exposed intermittently to nitrogen during the exposure to simultaneous flows of the tungsten-containing precursor and the reducing agent, wherein the chamber pressure is greater than about 60 Torr during the first CVD process, and wherein the multiple pulses of the reducing agent are without any intervening tungsten-containing precursor pulses.

17. A method of forming a tungsten film on a semiconductor substrate in a chamber, the method comprising:

depositing a tungsten bulk layer by a chemical vapor deposition (CVD) process comprising two or more cycles, wherein a cycle comprises at least one CVD operation in which a tungsten-containing precursor is reduced by a reducing agent in the absence of nitrogen to deposit tungsten and at least one CVD operation in which a tungsten-containing precursor is reduced by a reducing agent in the presence of nitrogen to deposit tungsten, wherein the process pressure during the CVD process is maintained at least about 60 Torr.

18. The method of claim 17, wherein the process pressure is maintained at least about 80 Torr throughout the CVD process.

19. The method of claim 17, wherein the substrate temperature throughout the CVD process is at least about 420° C.

* * * * *